United States Patent
Sie et al.

(10) Patent No.: US 11,923,454 B2
(45) Date of Patent: Mar. 5, 2024

(54) EPITAXIAL STRUCTURE HAVING SUPER-LATTICE LAMINATES

(71) Applicant: GlobalWafers Co., Ltd., Hsinchu (TW)

(72) Inventors: Wei-Jie Sie, Hsinchu (TW); Jia-Zhe Liu, Hsinchu (TW); Ying-Ru Shih, Hsinchu (TW)

(73) Assignee: GLOBALWAFERS CO., LTD., Hsinchu (TW)

( * ) Notice: Subject to any disclaimer, the term of this patent is extended or adjusted under 35 U.S.C. 154(b) by 0 days.

(21) Appl. No.: 17/238,330

(22) Filed: Apr. 23, 2021

(65) Prior Publication Data

US 2021/0336058 A1 Oct. 28, 2021

(30) Foreign Application Priority Data

Apr. 24, 2020 (TW) .................................. 109113779

(51) Int. Cl.
*H01L 29/78* (2006.01)
*H01L 29/15* (2006.01)
*H01L 29/778* (2006.01)

(52) U.S. Cl.
CPC ........ *H01L 29/7849* (2013.01); *H01L 29/157* (2013.01); *H01L 29/7787* (2013.01)

(58) Field of Classification Search
CPC ............... H01L 29/157; H01L 29/7787; H01L 29/7849
See application file for complete search history.

(56) References Cited

U.S. PATENT DOCUMENTS

| 6,586,774 B2* | 7/2003 | Ishibashi | H01L 33/007 257/97 |
| 7,518,154 B2* | 4/2009 | Otsuka | H01L 29/812 257/194 |
| 7,652,282 B2* | 1/2010 | Yanagihara | H01L 21/02381 257/19 |
| 8,247,842 B2* | 8/2012 | Sato | H01L 29/205 257/190 |

(Continued)

FOREIGN PATENT DOCUMENTS

CN 102714162 B 4/2015

*Primary Examiner* — Jay C Kim
(74) *Attorney, Agent, or Firm* — Li & Cai Intellectual Property (USA) Office (57) ABSTRACT

An epitaxial structure includes a substrate, a lower super-lattice laminate, a middle super-lattice laminate, an upper super-lattice laminate and a channel layer. The lower super-lattice laminate includes a plurality of first lower film layers and a plurality of second lower film layers stacked alternately. The first lower film layer includes aluminum nitride. The second lower film layer includes aluminum gallium nitride. The middle super-lattice laminate includes a plurality of first middle film layers and a plurality of second middle film layers stacked alternately. The first middle film layer includes aluminum nitride. The second middle film layer includes gallium nitride doped with a doping material. The upper super-lattice laminate includes a plurality of first upper film layers and a plurality of second upper film layers stacked alternately. The first upper film layer includes gallium nitride doped with the doping material. The second upper film layer includes gallium nitride.

8 Claims, 11 Drawing Sheets

(56) References Cited

U.S. PATENT DOCUMENTS

| | | | |
|---|---|---|---|
| 8,264,001 B2* | 9/2012 | Sato | H01L 29/7787 257/190 |
| 8,405,064 B2* | 3/2013 | Yamaguchi | H01L 29/66462 257/12 |
| 8,530,935 B2* | 9/2013 | Yanagihara | H01L 29/155 257/190 |
| 8,536,615 B1* | 9/2013 | Driscoll | H01L 21/02458 257/101 |
| 8,742,396 B2 | 6/2014 | Ooshika | |
| 9,090,993 B2* | 7/2015 | Miyoshi | H01L 21/0254 |
| 9,112,077 B1* | 8/2015 | Liao | H01L 21/02458 |
| 9,184,242 B2* | 11/2015 | Kaneko | H01L 21/0251 |
| 9,287,369 B2* | 3/2016 | Hikosaka | H01L 21/02458 |
| 9,991,346 B2* | 6/2018 | Derluyn | H01L 21/0262 |
| 10,418,240 B2* | 9/2019 | Lin | H01L 29/205 |
| 10,586,701 B2* | 3/2020 | Shikauchi | H01L 29/7786 |
| 10,727,303 B2* | 7/2020 | Ikuta | H01L 29/155 |
| 10,818,491 B2* | 10/2020 | Zhao | H01L 29/0649 |
| 11,081,346 B2* | 8/2021 | Charles | H01L 21/02551 |
| 11,387,356 B2* | 7/2022 | Chen | H01L 21/02507 |
| 2008/0296625 A1* | 12/2008 | Li | H01L 21/02463 257/E21.09 |
| 2013/0307023 A1* | 11/2013 | Kokawa | H01L 21/02458 257/190 |
| 2017/0323960 A1* | 11/2017 | Sato | H01L 21/02507 |
| 2022/0115520 A1* | 4/2022 | Li | H01L 29/0649 |

\* cited by examiner

EPITAXIAL STRUCTURE HAVING SUPER-LATTICE LAMINATES

CROSS-REFERENCE TO RELATED PATENT APPLICATION

This application claims the benefit of priority to Taiwan Patent Application No. 109113779, filed on Apr. 24, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an epitaxial structure, and more particularly to an epitaxial structure having super-lattice laminates.

BACKGROUND OF THE DISCLOSURE

Nitride semiconductors are characterized by high saturated electron velocity and wide band gap. Therefore, in addition to being applied to light-emitting semiconductor devices, the nitride semiconductors have also been widely used in compound semiconductor devices with high-breakdown voltage and high-power output.

For example, in a high electron mobility transistor (HEMT), a gallium nitride channel layer (channel GaN layer) is epitaxially formed on a silicon substrate to form an epitaxial structure. However, in the above epitaxial structure, the stress of the gallium nitride channel layer on the silicon substrate during an epitaxial process is difficult to control. Furthermore, the gallium nitride channel layer has poor vertical withstand voltage. In addition, due to the large difference between the lattice constant of the gallium nitride channel layer (channel GaN layer) and the lattice constant of the silicon substrate, the conventional epitaxial structure often has the problem of poor epitaxial quality.

SUMMARY OF THE DISCLOSURE

In response to the above-referenced technical inadequacies, the present disclosure provides an epitaxial structure having super-lattice laminates.

In one aspect, the present disclosure provides an epitaxial structure having super-lattice laminates. The epitaxial structure includes a substrate, a lower super-lattice laminate, a middle super-lattice laminate, an upper super-lattice laminate and a channel layer. The lower super-lattice laminate is disposed on the substrate. The lower super-lattice laminate includes: a plurality of first lower film layers and a plurality of second lower film layers stacked periodically and alternately with each other. Each of the first lower film layers includes aluminum nitride (AlN), and each of the second lower film layers includes aluminum gallium nitride (Al-GaN). The middle super-lattice laminate is disposed on the lower super-lattice laminate. The middle super-lattice laminate includes: a plurality of first middle film layers and a plurality of second middle film layers stacked alternately with each other. Each of the first middle film layers includes aluminum nitride (AlN), and each of the second middle film layers includes gallium nitride doped with a doping material (doped-GaN). The upper super-lattice laminate is disposed on the middle super-lattice laminate. The upper super-lattice laminate includes: a plurality of first upper film layers and a plurality of second upper film layers stacked alternately with each other. Each of the first upper film layers includes gallium nitride doped with the doping material (doped-GaN), and each of the second upper film layers includes gallium nitride (GaN). The channel layer is disposed on the upper super-lattice laminate, and the channel layer includes gallium nitride (GaN).

Therefore, the stress generated by the epitaxial structure during the epitaxial process can be controlled by virtue of the buffer layer composed of the lower, middle, and upper super-lattice laminates. In addition, the epitaxial structure can have better vertical withstand voltage and better epitaxial quality. Each functional layer and the adjacent functional layer of the epitaxial structure can have a better degree of match in lattice constant by virtue of the material selections of the film layers in the lower, middle, and upper super-lattice laminates. Therefore, the entire epitaxial structure can have better epitaxial quality.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
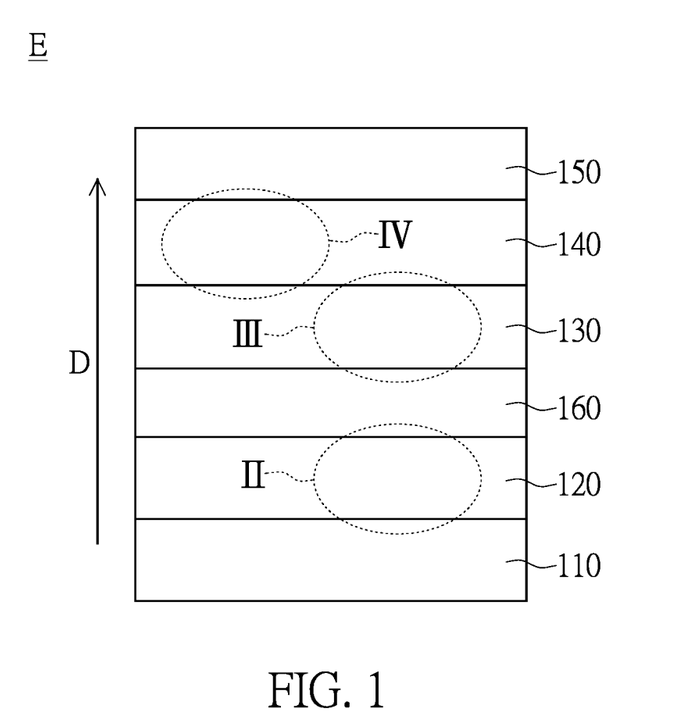
FIG. 1 is a schematic view of an epitaxial structure according to a first embodiment of the present disclosure.

Referring to FIG. 1, a first embodiment of the present disclosure provides an epitaxial structure E having super-lattice laminates.

The epitaxial structure E of the present embodiment is particularly suitable for application in high electron mobility transistors (HEMT), but the present disclosure is not limited thereto.

More specifically, the epitaxial structure E of the present embodiment includes a substrate 110, a lower super-lattice laminate 120, a middle super-lattice laminate 130, an upper super-lattice laminate 140 and a channel layer 150 that are stacked sequentially from bottom to top.

In addition, the epitaxial structure E of the present embodiment may further include an insertion layer 160, and the insertion layer 160 is disposed between the lower super-lattice laminate 120 and the middle super-lattice laminate 130, but the present disclosure is not limited thereto.

In other words, in the present embodiment, the substrate 110 is disposed at the bottom of the epitaxial structure E. The lower super-lattice laminate 120 is disposed on a surface of the substrate 110. The insertion layer 160 is disposed on a surface of the lower super-lattice laminate 120 away from the substrate 110. The middle super-lattice laminate 130 is disposed on a surface of the insertion layer 160 away from the lower super-lattice laminate 120. The upper super-lattice laminate 140 is disposed on a surface of the middle super-lattice laminate 130 away from the insertion layer 160. In addition, the channel layer 150 is disposed on a surface of the upper super-lattice laminate 140 away from the middle super-lattice laminate 130 and disposed at the top of the epitaxial structure E.

The afore-mentioned lower super-lattice laminate 120, middle super-lattice laminate 130, and upper super-lattice laminate 140 can be collectively defined as a buffer layer.

It should be noted that the term "super-lattice laminate" as described herein refers to a periodically alternating laminate structure composed of two or more materials. In the present embodiment, the super-lattice laminate includes two or more than three types of film layer units. Each of the film layer units includes a binary, ternary, or quaternary material, and a thickness of each of the film layer units is between a few nanometers and a few hundred nanometers.

Referring further to FIG. 1, the substrate 110 may be a semi-insulated substrate or a conductive substrate. Furthermore, the substrate 110 may be, for example, a silicon substrate or a substrate with a silicon surface, such as Si(111), Si(100), Si(110), textured Si surface, silicon on insulation (SOI), silicon on sapphire (SOS), and silicon wafers bonded to other materials (i.e., AlN, diamond or other polycrystalline materials).

The substrate 110 may also be, for example, other substrate material that can be used to replace silicon substrate, such as aluminum oxide ($Al_2O_3$) substrate, silicon carbide (SiC) substrate, and gallium arsenide (GaAs) substrate. In the present embodiment, the substrate 110 is preferably a silicon substrate.

Figure 2:
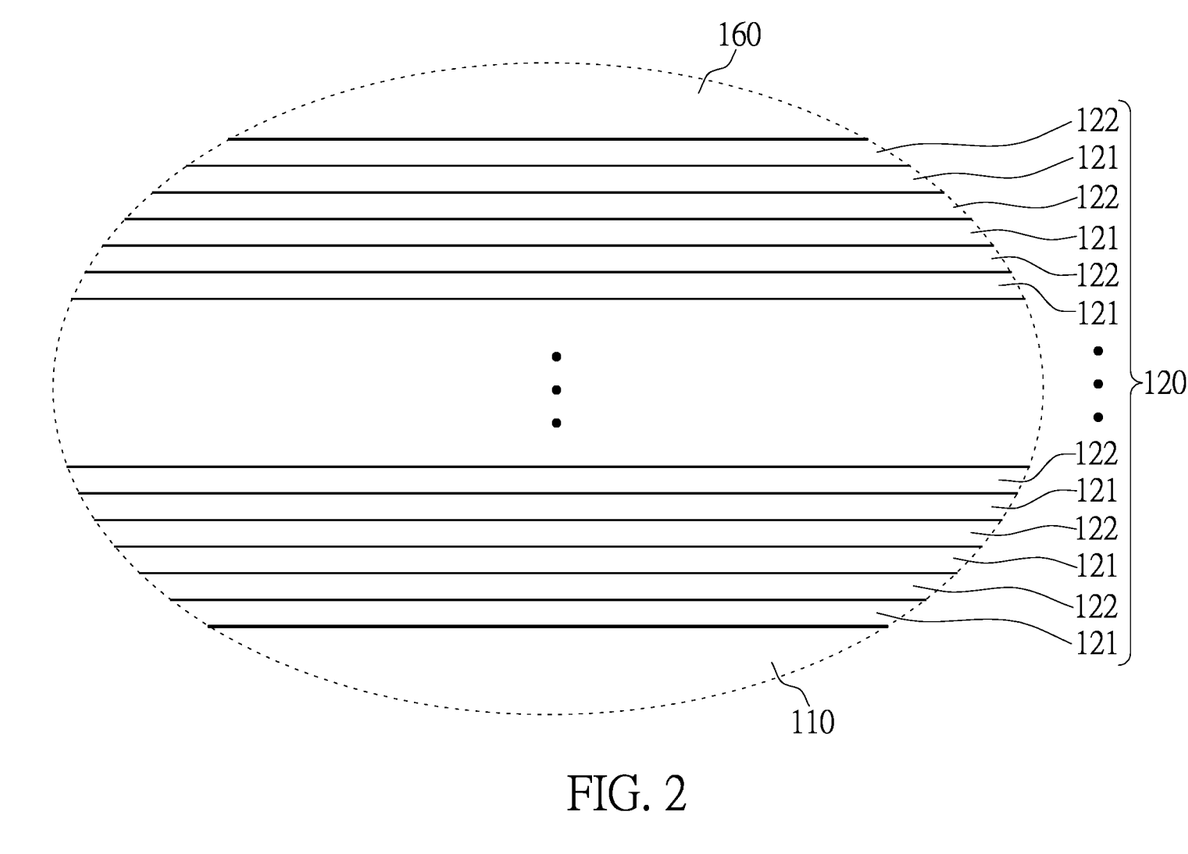
FIG. 2 is a partial enlarged view of a region II of FIG. 1.

As shown in FIG. 2, a partial enlarged view of the lower super-lattice laminate 120 in FIG. 1 is illustrated. The lower super-lattice laminate 120 of the present embodiment includes a plurality of first lower film layers 121 and a plurality of second lower film layers 122. The plurality of first lower film layers 121 and the plurality of second lower film layers 122 are periodically and alternately stacked on the substrate 110. Furthermore, a main material of each of the first lower film layers 121 is aluminum nitride (AlN), and a main material of each of the second lower film layers 122 is aluminum gallium nitride (AlGaN).

It should be noted that the term "main material of film layer" as described herein refers to a material composition that accounts for greater than 90% of the content in the film layer.

Furthermore, as shown in FIG. 1, a direction of the substrate 110 of the epitaxial structure E toward the channel layer 150 is defined as a thickness growth direction D.

Further referring to FIG. 2, an initial film layer of the lower super-lattice laminate 120 along the thickness growth direction D is the first lower film layer 121 (AlN), and a final film layer is the second lower film layer 122 (AlGaN). Furthermore, the plurality of first and second lower film layers in the lower super-lattice laminate 120 are stacked periodically and alternately in accordance with a sequence of the first lower film layer 121 (AlN), the second lower film layer 122 (AlGaN), the first lower film layer 121 (AlN), and the second lower film layer 122 (AlGaN), and so on.

A quantity of the plurality of first lower film layers 121 and a quantity of the plurality of second lower film layers 122 may each be between several layers and hundreds of layers according to product design requirements. Furthermore, a thickness of each of the first lower film layers 121 (AlN) is usually between 1 nanometer and 50 nanometers, preferably between 1 nanometer and 20 nanometers, and more preferably between 1 nanometer and 10 nanometers. In addition, a thickness of each of the second lower film layers 122 (AlGaN) is usually between 1 nanometer and 100 nanometers, preferably between 1 nanometer and 50 nanometers, and more preferably between 10 nanometers and 50 nanometers, but the present disclosure is not limited thereto.

An epitaxial temperature of the plurality of first lower film layers 121 and the plurality of second lower film layers 122 is preferably between 800° C. and 1,200° C., but the present disclosure is not limited thereto.

In terms of content, nitrogen (N) contents and aluminum (Al) contents in the plurality of first lower film layers 121 (AlN) are all constant values, but the present disclosure is not limited thereto.

Figure 5:
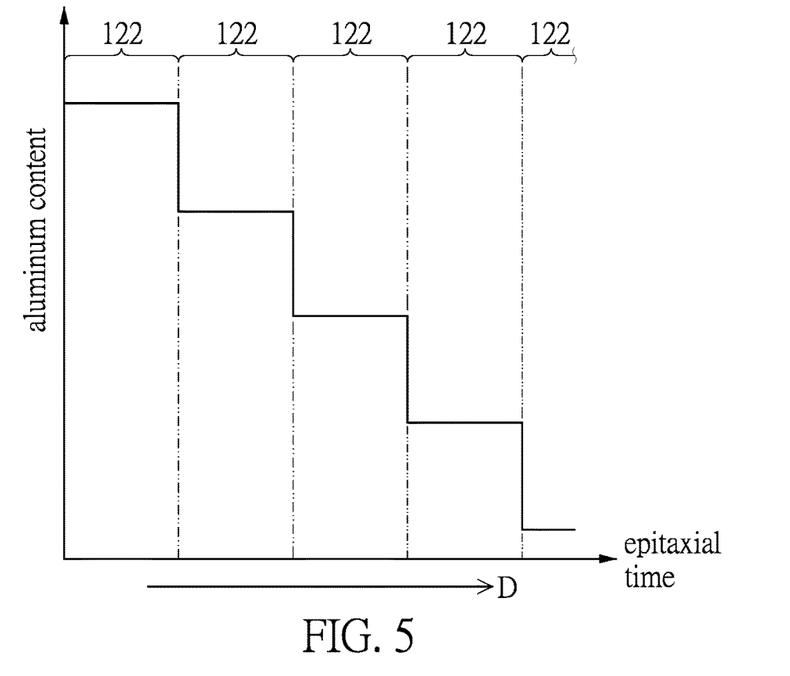
FIG. 5 is a schematic view showing that aluminum (Al) contents in a plurality of second lower film layers decrease stepwise along a thickness growth direction according to the first embodiment of the present disclosure.
Figure 6:
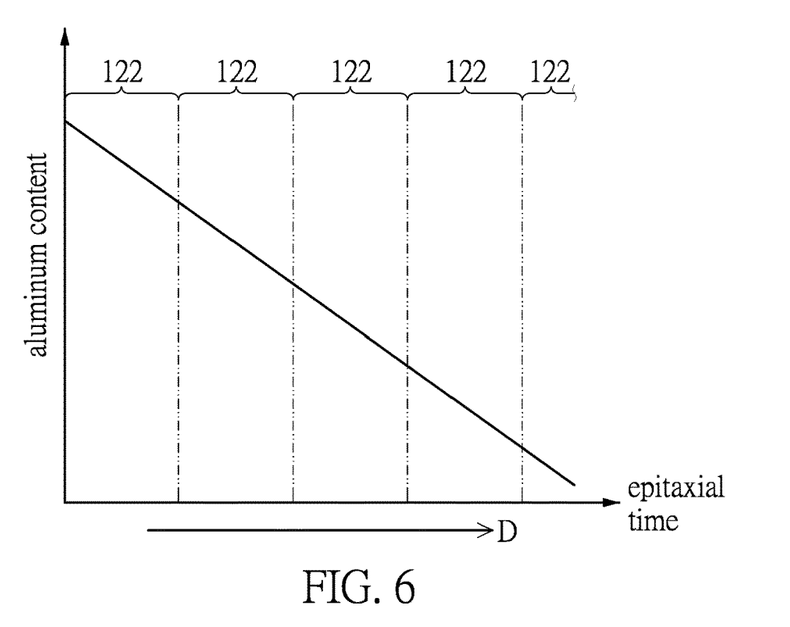
FIG. 6 is a schematic view showing that the aluminum (Al) contents in the plurality of second lower film layers decrease linearly along the thickness growth direction according to the first embodiment of the present disclosure.

Furthermore, nitrogen (N) contents in the plurality of second lower film layers 122 (AlGaN) are constant values. Aluminum (Al) contents in the plurality of second lower film layers 122 (AlGaN) decrease along the thickness growth direction D of the epitaxial structure E (as shown in FIG. 5 and FIG. 6). Gallium (Ga) contents in the plurality of second lower film layers 122 increase along the thickness growth direction D of the epitaxial structure E (not shown in the drawings).

Based on a sum of the aluminum (Al) contents and the gallium (Ga) contents being 100%, an initial content of the aluminum (Al) contents along the thickness growth direction D is between 70% and 90%, and a final content of the aluminum (Al) contents along the thickness growth direction D is between 10% and 30%. Furthermore, the gallium (Ga) contents increase as the aluminum (Al) contents decrease, an initial content of the gallium (Ga) contents along the thickness growth direction D is between 10% and 30%, and a final content of the gallium (Ga) contents along the thickness growth direction D is between 70% and 90%.

It should be noted that, the content unit "%" mentioned in the present article refers to "atomic concentration (at. %)".

In terms of content change, the aluminum (Al) contents can be decreased in steps, for example, as shown in FIG. 5. Furthermore, the aluminum (Al) contents can also be decreased linearly, for example, as shown in FIG. 6, but the present disclosure is not limited thereto.

According to the above-mentioned aluminum (Al) content change and gallium (Ga) content change, a lattice constant of the lower super-lattice laminate 120 close to the substrate 110 (i.e., silicon substrate) matches a lattice constant of the substrate 110. Furthermore, a lattice constant of the lower super-lattice laminate 120 close to the insertion layer 160 matches a lattice constant of the insertion layer 160 (i.e., gallium nitride insertion layer).

Furthermore, in the lower super-lattice laminate 120, the material composition of aluminum nitride (AlN) is used for stress control, especially the stress control of a gallium nitride (GaN) epitaxy on a silicon substrate. Accordingly, the stress of the epitaxial structure E during an epitaxial process can be adjusted, thereby preventing the epitaxial structure E from being excessively warped and cracked.

In addition, the material composition of the second lower film layer 122, aluminum gallium nitride (AlGaN), is used for stress control and lattice constant control, especially through changes in aluminum (Al) content and gallium (Ga) content, so that the lattice constant of the lower super-lattice laminate 120 is adjusted to match the lattice constant of the silicon substrate 110 and the lattice constant of the gallium nitride insertion layer 160, respectively. Therefore, the epitaxial structure E can have better epitaxial quality.

Referring further to FIG. 1, the insertion layer 160 is disposed between the lower super-lattice laminate 120 and the middle super-lattice laminate 130. A main material of the insertion layer 160 is gallium nitride (GaN), and therefore the insertion layer 160 can also be referred to as a gallium nitride insertion layer. A thickness of the insertion layer 160 is usually between 30 nanometers and 500 nanometers, preferably between 50 nanometers and 500 nanometers, and more preferably between 50 nanometers and 300 nanometers. An epitaxial temperature of the insertion layer 160 is preferably between 800° C. and 1,200° C. The nitrogen (N) content and gallium (Ga) content of the insertion layer 160 (GaN) are both constant values. In an embodiment of the present disclosure, a surface roughness (RMS) of an interface between the insertion layer 160 and the middle super-lattice laminate 130 is not less than 0.5 nanometers, and preferably between 0.5 nanometers and 2 nanometers, but the present disclosure is not limited thereto. According to the above configuration, the insertion layer 160 is mainly used to block defects and improve epitaxial quality in upper epitaxial layers. It is worth mentioning that, if the surface roughness of the interface is less than 0.5 nanometers, the surface of the insertion layer becomes too flat, and is unable to achieve the effect of blocking defects. In addition, if the surface roughness of the interface is greater than 2 nanometers, the surface of the insertion layer becomes too rough, and results in poor epitaxial quality in the upper epitaxial layers.

Figure 3:
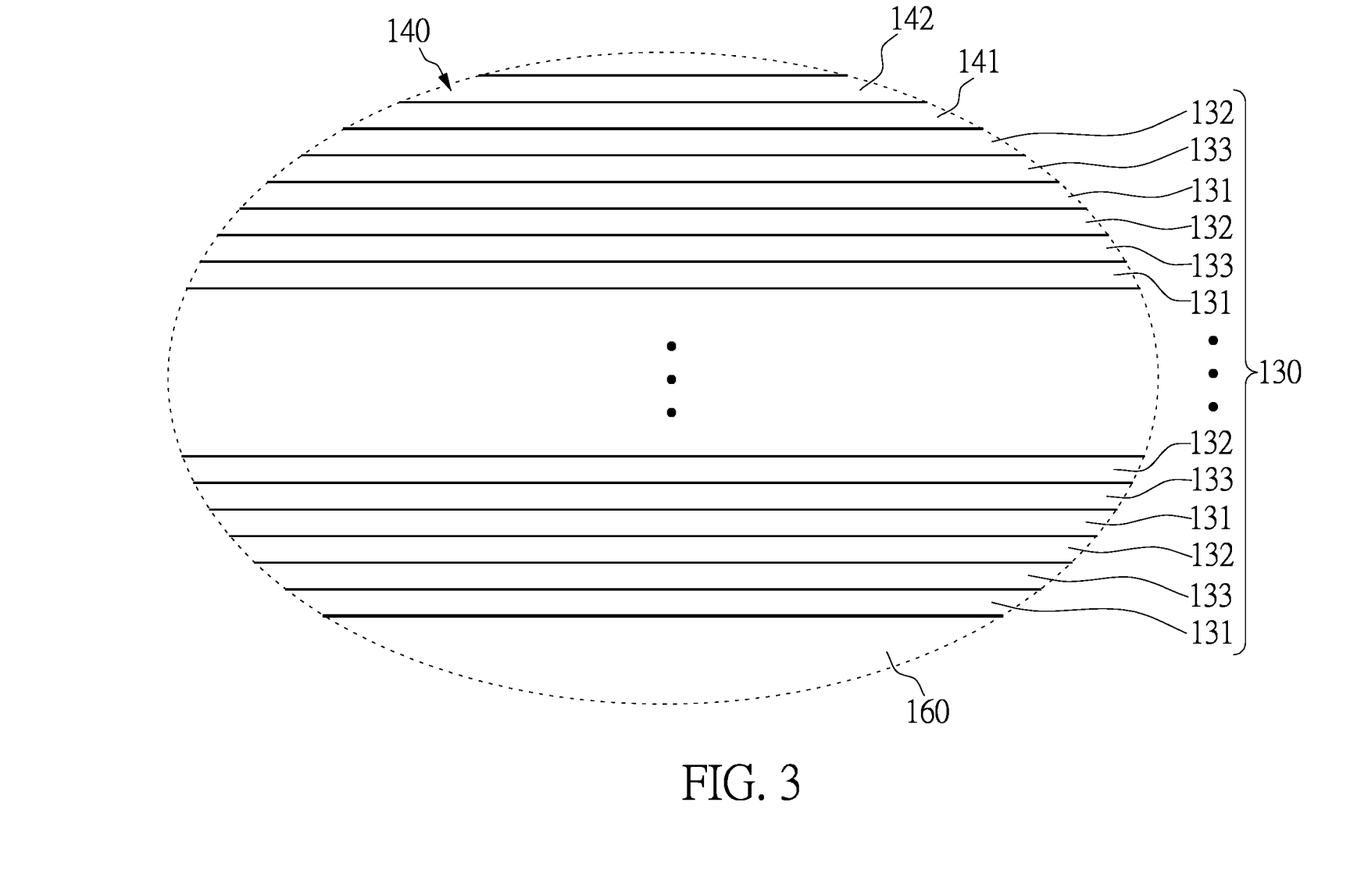
FIG. 3 is a partial enlarged view of a region III of FIG. 1.

As shown in FIG. 3, a partial enlarged view of the middle super-lattice laminate 130 in FIG. 1 is illustrated. The middle super-lattice laminate 130 of the present embodiment includes: a plurality of first middle film layers 131, a plurality of second middle film layers 132, and a plurality of third middle film layers 133. The plurality of first middle film layers 131 and the plurality of second middle film layers 132 are periodically and alternately stacked on the insertion layer 160. The plurality of third middle film layers 133 are respectively disposed between the plurality of first middle film layers 131 and the plurality of second middle film layers 132. In other words, each of the first middle film layers 131 and an adjacent one of the second middle film layers 132 have one of the third middle film layers 133 disposed therebetween.

Furthermore, a main material of each of the first middle film layers 131 is aluminum nitride (AlN), a main material of each of the second middle film layers is gallium nitride (GaN), and a main material of each of the third middle film layers is gallium nitride (GaN).

Furthermore, the main material of each of the second middle film layers 132 and the main material of each of the third middle film layers 133 are both gallium nitride. The difference is that the gallium nitride in each of the second middle film layers 132 is gallium nitride doped with a doping material (doped-GaN), and the gallium nitride in each of the third middle film layers 133 is gallium nitride that is not doped with the doping material (un-doped GaN).

The doping material may be, for example, carbon element or iron element. That is, the gallium nitride in each of the second middle film layers 132 may be, for example, carbon-doped gallium nitride (carbon-doped GaN) or iron-doped gallium nitride (iron-doped GaN), but the present disclosure is not limited thereto. The doping material may also be, for example, manganese (Mn), magnesium (Mg), vanadium (V), chromium (Cr), beryllium (Be), boron (B) and other elements with similar properties. Furthermore, the gallium nitride in each of the second middle film layers 132 is not limited to being doped with only one doping material and can also be doped with two or more doping materials according to product design requirements.

Referring further to FIG. 3, an initial film layer of the middle super-lattice laminate 130 along the thickness growth direction D is the first middle film layer 131 (AlN), and a final film layer is the second middle film layer 132 (doped-GaN). Furthermore, the plurality of first, second and third middle film layers in the super-lattice laminate 130 are stacked periodically and alternately in accordance with a sequence of the first middle film layer 131 (AlN), the third middle film layer 133 (un-doped GaN), the second middle film layer 132 (doped-GaN), the first middle film layer 131 (AlN), the third middle film layer 133 (un-doped GaN), the second middle film layer 132 (doped-GaN), and so on.

A quantity of the plurality of first middle film layers 131, a quantity of the plurality of second middle film layers 132, and a quantity of the plurality of third middle film layers 133, may each be between several layers and hundreds of layers according to product design requirements. Furthermore, a thickness of each of the first middle film layers 131 (AlN) is usually between 1 nanometer and 50 nanometers, preferably between 1 nanometer and 20 nanometers, and more preferably between 1 nanometer and 10 nanometers. A thickness of each of the second middle film layers 132 (doped-GaN) is usually between 1 nanometer and 100 nanometers, preferably between 10 nanometers and 100 nanometers, and more preferably between 10 nanometers and 50 nanometers. In addition, a thickness of each of the third middle film layers 133 (un-doped GaN) is usually between 1 nanometer and 100 nanometers, preferably between 10 nanometers and 100 nanometers, and more preferably between 10 nanometers and 50 nanometers.

An epitaxial temperature of the plurality of first middle film layers 131, the plurality of second middle film layers 132, and the plurality of third middle film layers 133 is preferably between 800° C. and 1,200° C., but the present disclosure is not limited thereto.

In terms of content, nitrogen (N) contents and aluminum (Al) contents in the plurality of first middle film layers 131 (AlN) are constant values. Furthermore, nitrogen (N) contents and gallium (Ga) contents in the plurality of second middle film layers 132 (doped-GaN) are constant values, and nitrogen (N) contents and gallium (Ga) contents in the plurality of third middle film layers 133 (un-doped GaN) are also constant values, but the present disclosure is not limited thereto.

In terms of doping concentration of doping material (i.e., carbon element, iron element, manganese element, magnesium element, vanadium element, chromium element, beryllium element, or boron element), a maximum doping concentration of doping concentrations in the plurality of second middle film layers 132 (doped-GaN) is usually not less than $1E18/cm^3$, preferably between $1E18/cm^3$ and $1E21/cm^3$, and more preferably between $1E19/cm^3$ and $1E20/cm^3$. If the doping concentration is too low, a desired vertical withstand voltage cannot be achieved.

Figure 7:
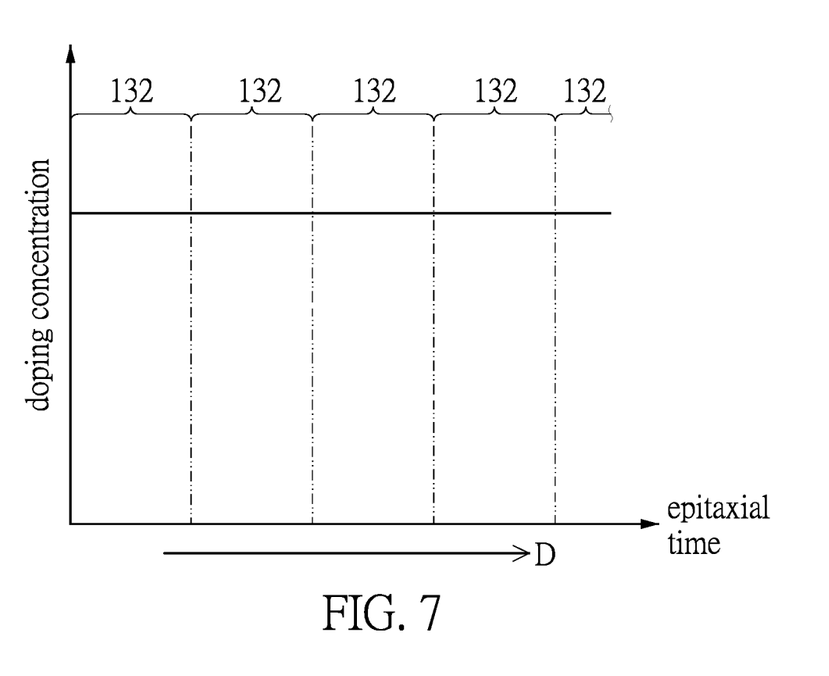
FIG. 7 is a schematic view showing that doping concentrations in a plurality of second middle film layers maintain at a maximum doping concentration according to the first embodiment of the present disclosure.

As shown in FIG. 7, in an embodiment of the present disclosure, the doping concentrations in the plurality of second middle film layers 132 (doped-GaN) are maintained at the maximum doping concentration (i.e., not less than $1E18/cm^3$). Therefore, the epitaxial structure E has a better vertical withstand voltage, but the present disclosure is not limited thereto.

Figure 8:
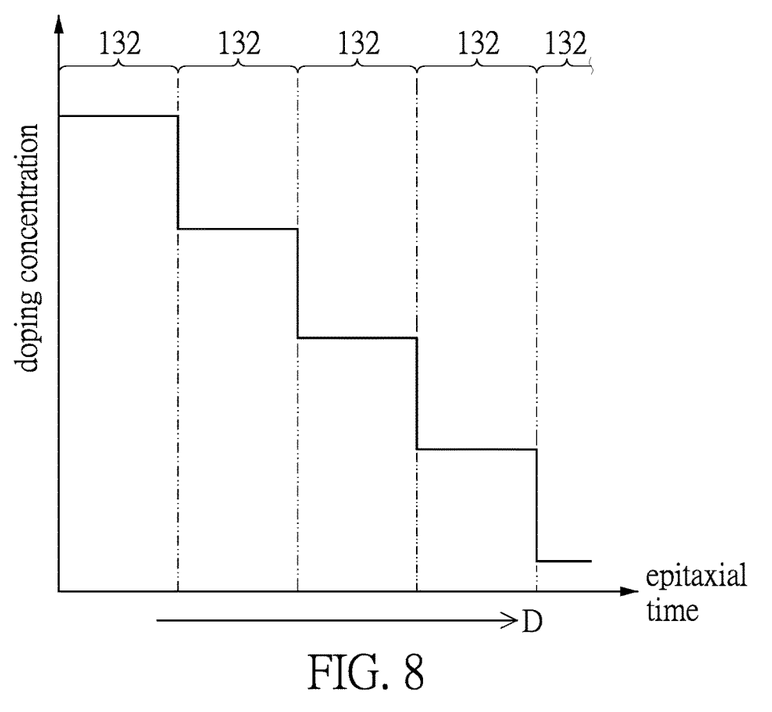
FIG. 8 is a schematic view showing that the doping concentrations in the plurality of second middle film layers decrease stepwise along the thickness growth direction according to the first embodiment of the present disclosure.
Figure 9:
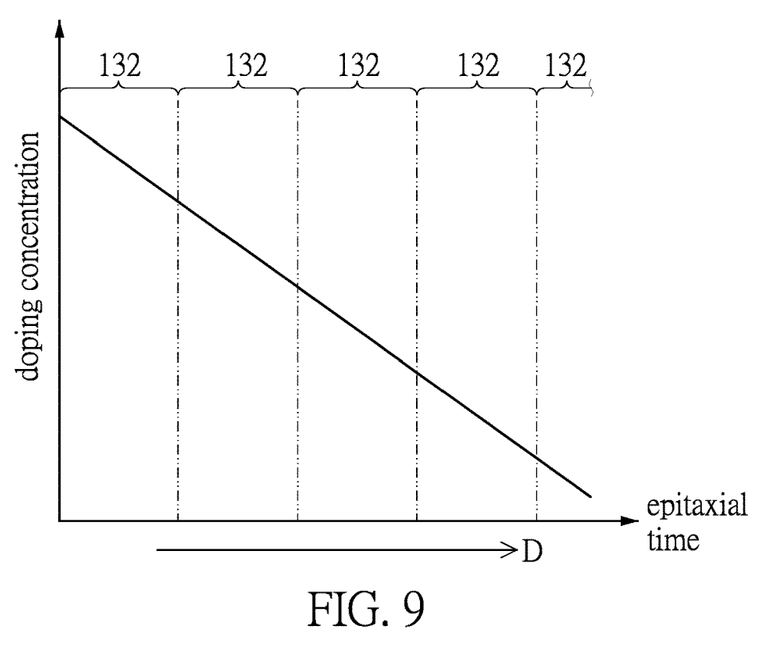
FIG. 9 is a schematic view showing that the doping concentrations in the plurality of second middle film layers decrease linearly along the thickness growth direction according to the first embodiment of the present disclosure.

For example, as shown in FIG. 8 and FIG. 9, in another embodiment of the present disclosure, an initial doping concentration of the doping concentrations in the plurality of second middle film layers 132 (doped-GaN) along the thickness growth direction D is the maximum doping concentration (i.e., the doping concentration of not less than $1E18/cm^3$). The doping concentrations in the plurality of second middle film layers 132 (doped-GaN) decrease from the maximum doping concentration along the thickness growth direction D. In addition, a final doping concentration of the doping concentrations in the plurality of second middle film layers 132 (doped-GaN) along the thickness growth direction D is a minimum doping concentration.

In terms of doping concentration change, the doping concentrations can be decreased in steps, for example, as shown in FIG. 8. Furthermore, the doping concentrations can also be decreased linearly, for example, as shown in FIG. 9, but the present disclosure is not limited thereto.

It is worth mentioning that, although the doping material enables the epitaxial structure E to have a better vertical withstand voltage, the doping material also increases the surface roughness of the epitaxial layer, thereby affecting the epitaxial quality of the epitaxial structure E. To overcome the above-mentioned technical deficiency, in the embodiments of FIG. 8 and FIG. 9, the doping concentrations in the plurality of second middle film layers 132 (doped-GaN) present a distribution from high to low along the thickness growth direction D. Therefore, the epitaxial structures E of the embodiments can not only have a certain vertical withstand voltage, but can also have better epitaxial quality.

Furthermore, in the middle super-lattice laminate 130, the material composition of aluminum nitride (AlN) in the first middle film layer 131 is used for stress control. Accordingly, the stress of the epitaxial structure E during the epitaxial process can be adjusted, thereby preventing the epitaxial structure E from being excessively warped and cracked.

Figure 14:
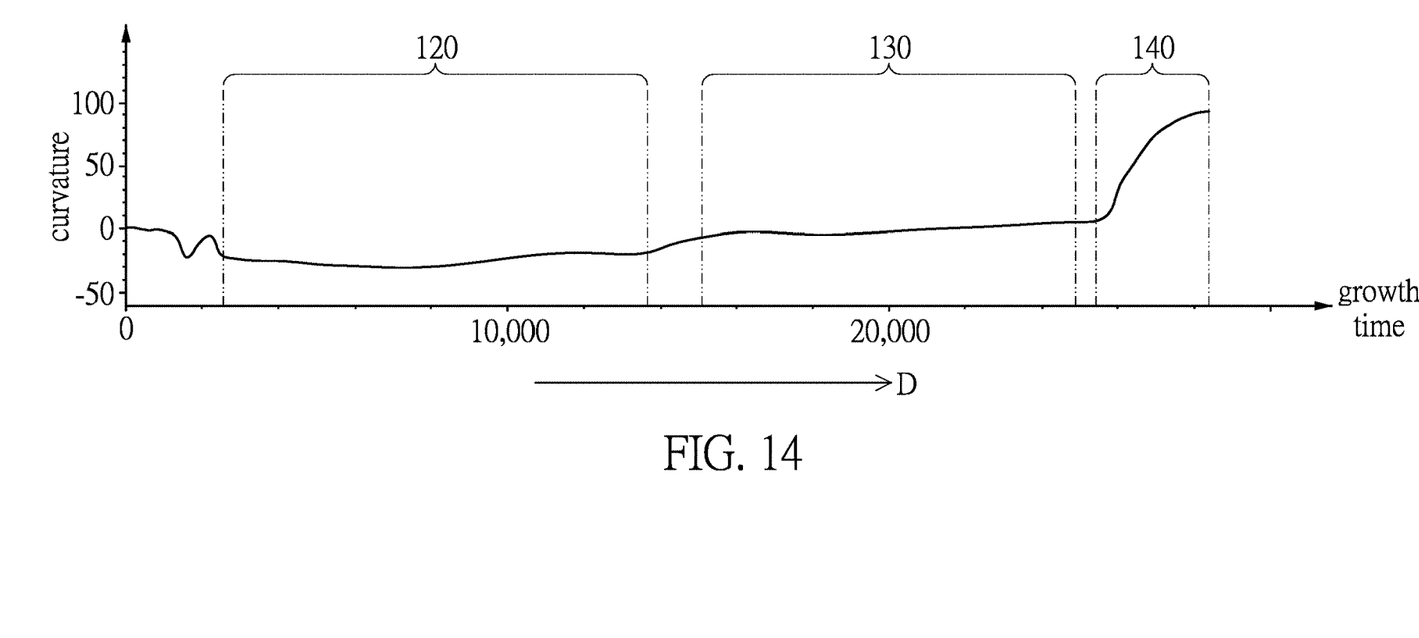
FIG. 14 is a schematic view showing a curvature change of the epitaxial structure during an epitaxial process according to the first embodiment of the present disclosure.

It is worth mentioning that, as shown in FIG. 14, during the epitaxial process of the middle super-lattice laminate 130, the epitaxial structure E can have a curvature of not more than 120 $km^{-1}$ through the stress control of the material composition of aluminum nitride (AlN), and preferably between −50 $km^{-1}$ and 120 $km^{-1}$.

The epitaxial structure E of the present embodiment can have better stress control through the arrangement of the middle super-lattice laminate 130. In addition, the finally produced epitaxial structure E can have a curvature of not more than 120 $km^{-1}$. Under the same epitaxial thickness, the epitaxial structure E of the present embodiment can have a smaller stress change and a shorter crack length than that of a conventional epitaxial structure E. Therefore, the epitaxial structure E of the present embodiment does not cause plastic deformation or cracking of a chip.

In addition, the material composition of gallium nitride (GaN) of each of the third middle film layers 133 enables the epitaxial structure E to form a flat surface during the epitaxial process. In an embodiment of the present disclosure, a surface roughness (RMS) of each of the third middle film layers 133 (un-doped GaN) is less than 1 nanometer, and preferably less than 0.5 nanometers.

In addition, by virtue of the material selection, the middle super-lattice laminate 130 of the present embodiment can have a better degree of match in lattice constant with the insertion layer 160 and the upper super-lattice laminate 140 that are adjacent to the middle super-lattice laminate 130, respectively.

Figure 4:
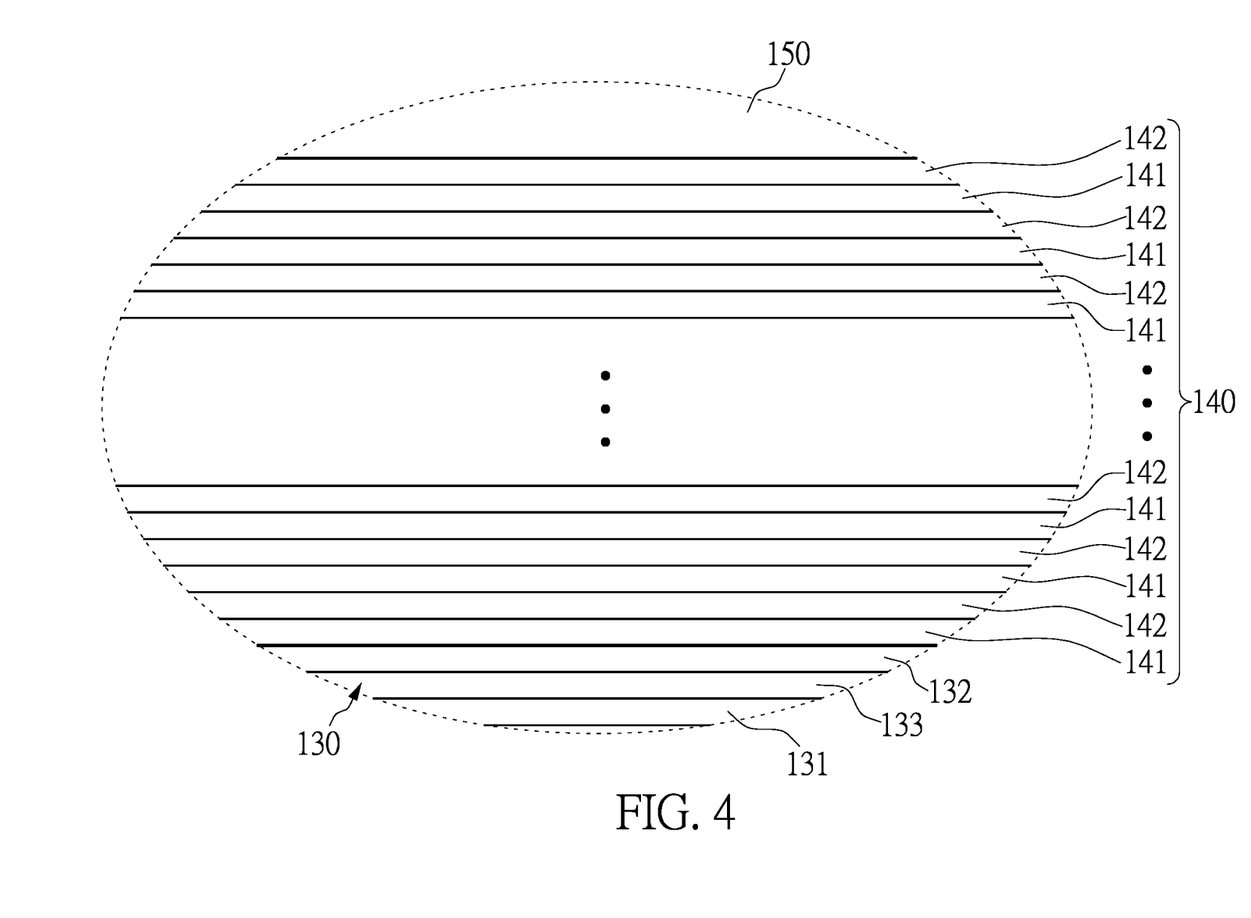
FIG. 4 is a partial enlarged view of a region IV of FIG. 1.

As shown in FIG. 4, a partial enlarged view of the upper super-lattice laminate 140 in FIG. 1 is illustrated. The upper super-lattice laminate 140 of the present embodiment includes a plurality of first upper film layers 141 and a plurality of second upper film layers 142. The plurality of first upper film layers 141 and the plurality of second upper film layers 142 are periodically and alternately stacked on the middle super-lattice laminate 130.

Furthermore, a main material of each of the first upper film layers 141 is gallium nitride (GaN), and a main material of each of the second upper film layers 142 is also gallium nitride (GaN). The difference is that the gallium nitride of each of the first upper film layers 141 is gallium nitride doped with a doping material (doped-GaN), and the gallium nitride of each of the second upper film layers 142 is gallium nitride that is not doped with the doping material (un-doped GaN). The material type of the doping material is described above and not repeated herein.

Referring further to FIG. 4, an initial film layer of the upper super-lattice laminate 140 along the thickness growth direction D is the first upper film layer 141 (doped-GaN), and a final film layer is the second upper film layer 142 (un-doped-GaN). Furthermore, the plurality of first and second upper film layers in the upper super-lattice laminate 140 are stacked periodically and alternately in accordance with a sequence of the first upper film layer 141 (doped-GaN), the second upper film layer 142 (un-doped-GaN), the first upper film layer 141 (doped-GaN), and the second upper film layer 142 (un-doped-GaN), and so on.

It is worth mentioning that, in the present embodiment, the upper super-lattice laminate 140 is disposed on the middle super-lattice laminate 130. The initial film layer of the upper super-lattice laminate 140 is the first upper film layer 141, and the main material of the first upper film layer 141 is the gallium nitride doped with the doping material (doped-GaN). The final film layer of the middle super-lattice laminate 130 is the second middle film layer 132, and the main material of the second middle film layer 132 is also the gallium nitride doped with the doping material (doped-GaN). That is, the material compositions of the two film layers connected to each other respectively in the upper super-lattice laminate 140 and the middle super-lattice laminate 130 are both the gallium nitride doped with the doping material (doped-GaN). Accordingly, the upper super-lattice laminate 140 and the middle super-lattice laminate 130 can have a better degree of match in lattice constant.

Furthermore, a quantity of the plurality of first upper film layers 141 and a quantity of the plurality of second upper film layers 142 may each be between several layers and hundreds of layers according to product design requirements. Furthermore, a thickness of each of the first upper film layers 141 (doped-GaN) is usually between 10 nanometers and 500 nanometers, preferably between 20 nanometers and 500 nanometers, and more preferably between 50 nanometers and 500 nanometers. A thickness of each of the second upper film layers 142 (un-doped GaN) is usually between 10 nanometers and 500 nanometers, preferably between 20 nanometers and 500 nanometers, and more preferably between 50 nanometers and 500 nanometers.

An epitaxial temperature of the plurality of first upper film layers 141 and the plurality of second upper film layers 142 is preferably between 800° C. and 1,200° C., but the present disclosure is not limited thereto.

In terms of content, nitrogen (N) contents and gallium (Ga) contents in the plurality of first upper film layers 141 (doped-GaN) are constant values. Furthermore, nitrogen (N) contents and gallium (Ga) contents in the plurality of second upper film layers 142 (un-doped GaN) are also constant values, but the present disclosure is not limited thereto.

In terms of doping concentration of doping material (i.e., carbon element or iron element), a maximum doping concentration of doping concentrations in the plurality of first upper film layers 141 (doped-GaN) is usually not less than $1E18/cm^3$, preferably between $1E18/cm^3$ and $1E21/cm^3$, and more preferably between $1E19/cm^3$ and $1E20/cm^3$. If the doping concentration is too low, a desired vertical withstand voltage cannot be achieved.

Figure 10:
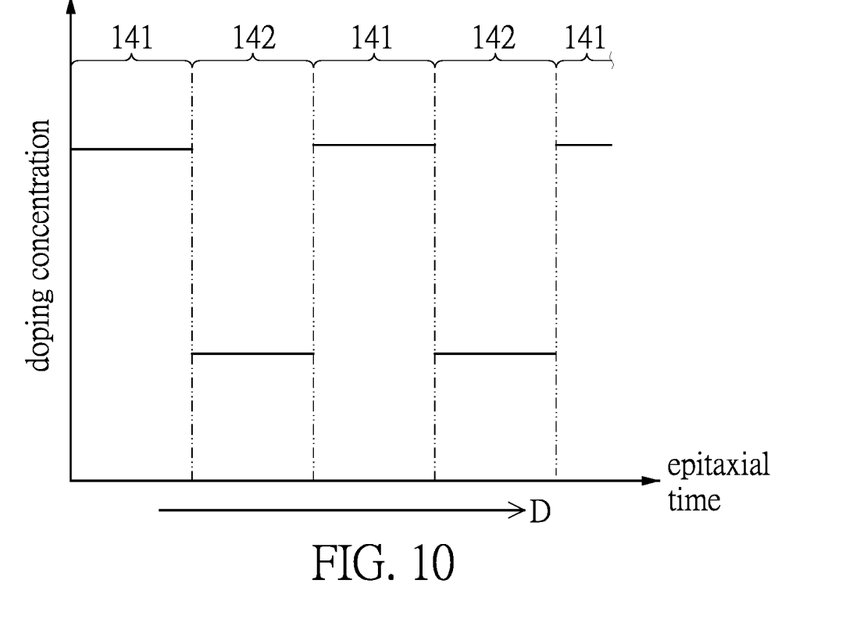
FIG. 10 is a schematic view showing that doping concentrations in a plurality of first upper film layers maintain at a maximum doping concentration.

As shown in FIG. 10, in an embodiment of the present disclosure, the doping concentrations in the plurality of first upper film layers 141 (doped-GaN) are maintained at the maximum doping concentration (i.e., not less than $1E18/cm^3$). Therefore, the epitaxial structure E has a better vertical withstand voltage, but the present disclosure is not limited thereto.

Figure 11:
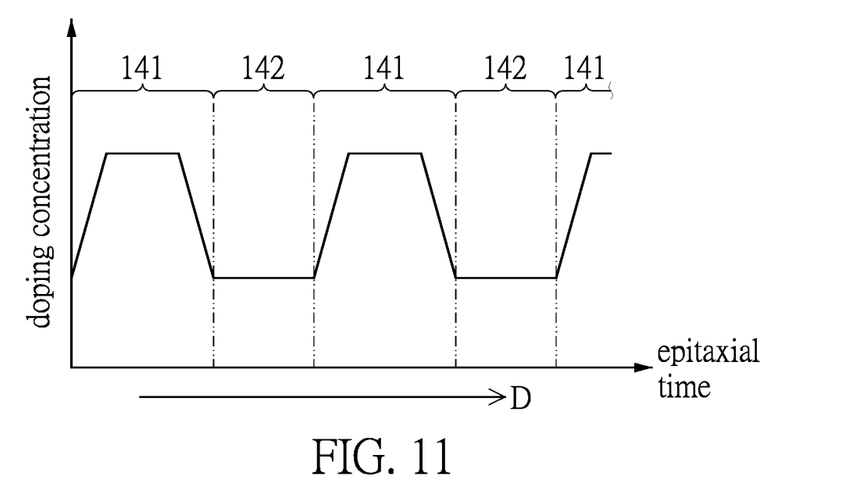
FIG. 11 is a first schematic view showing fixed and gradual changes of the doping concentrations in the plurality of first upper film layers according to the first embodiment of the present disclosure.
Figure 12:
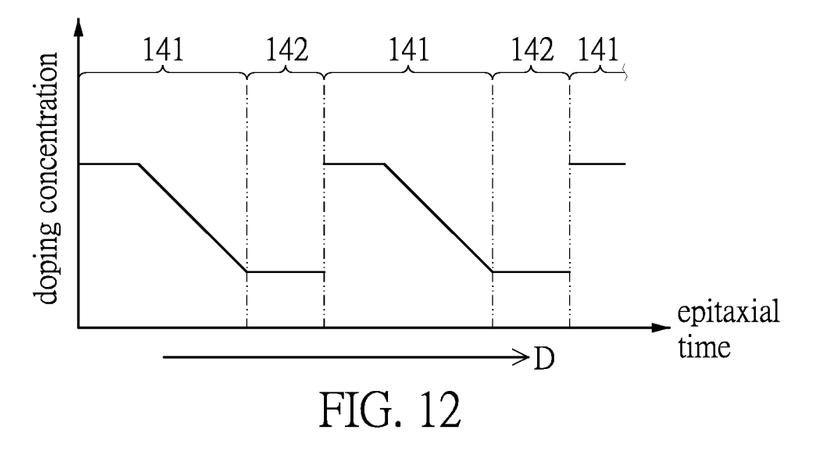
FIG. 12 is a second schematic view showing the fixed and gradual changes of the doping concentrations in the plurality of first upper film layers according to the first embodiment of the present disclosure.
Figure 13:
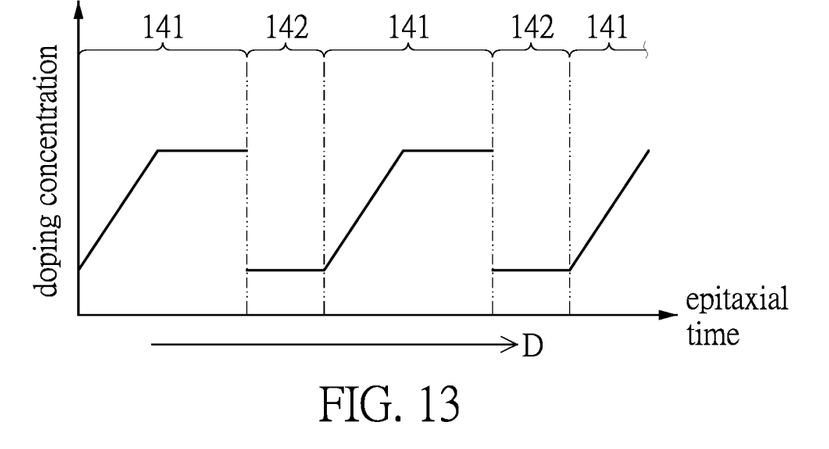
FIG. 13 is a third schematic view showing the fixed and gradual changes of the doping concentrations in the plurality of first upper film layers according to the first embodiment of the present disclosure.

For example, as shown in FIG. 11 to FIG. 13, in another embodiment of the present disclosure, the doping concentrations in the plurality of first upper film layers 141 (doped-GaN) exhibit fixed and gradual changes, and the maximum doping concentration (i.e., a doping concentration not less than $1E18/cm^3$) appears repeatedly or periodically in the plurality of the first upper film layers 141 (doped-GaN).

Furthermore, the material composition of the second upper film layer 142 is gallium nitride (GaN), which enables the epitaxial structure E to form a relatively flat surface during the epitaxial process. In an embodiment of the present disclosure, a surface roughness (RMS) of each of the second upper film layers 142 (un-doped GaN) is less than 1 nanometer, and preferably less than 0.5 nanometers.

Referring further to FIG. 1, a main material of the channel layer 150 is gallium nitride (GaN), and the gallium nitride (GaN) of the channel layer 150 is gallium nitride that is not doped with the doping material (un-doped GaN).

It is worth mentioning that, in the present embodiment, the channel layer 150 is disposed on the upper super-lattice laminate 140. A final film layer of the upper super-lattice laminate 140 is the second upper film layer 142, and the material composition of the second upper film layer 142 is also the gallium nitride that is not doped with the doping material (un-doped GaN). In other words, the channel layer 150 and the final film layer of the upper super-lattice laminate 140 are both the gallium nitride that is not doped with the doping material (un-doped GaN). Therefore, the channel layer 150 and the upper super-lattice laminate 140 can have a better degree of match in lattice constant.

Second Embodiment

Figure 15:
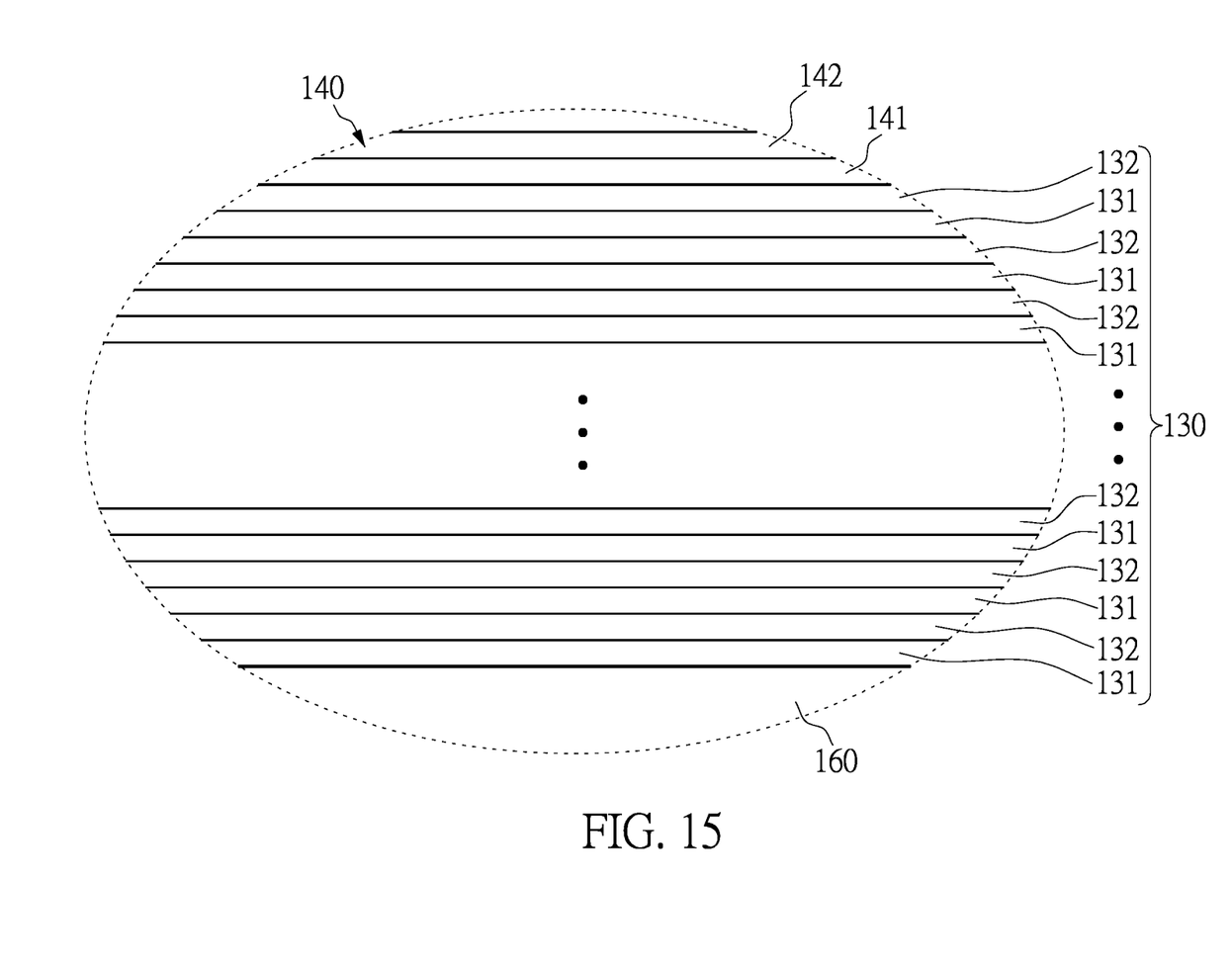
FIG. 15 is a schematic view of an epitaxial structure according to a second embodiment of the present disclosure.

As shown in FIG. 15, a second embodiment of the present disclosure provides an epitaxial structure E having super-lattice laminates. The epitaxial structure E of the present embodiment is substantially the same as the above-mentioned first embodiment. The difference is that the middle super-lattice laminate 130 of the present embodiment only includes a plurality of first middle film layers 131 (AlN) and a plurality of second middle film layers 132 (doped-GaN)

stacked on each other, and the middle super-lattice laminate 130 does not include any third middle film layer 133 (un-doped GaN).

Beneficial Effects of the Embodiments

In conclusion, the stress generated by the epitaxial structure during the epitaxial process can be controlled by virtue of the buffer layer composed of the lower, middle, and upper super-lattice laminates. In addition, the epitaxial structure can have better vertical withstand voltage and better epitaxial quality.

Each functional layer and the adjacent functional layer of the epitaxial structure can have a better degree of match in lattice constant by virtue of the material selections of the film layers in the lower, middle, and upper super-lattice laminates. Therefore, the entire epitaxial structure can have better epitaxial quality.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An epitaxial structure having super-lattice laminates, comprising:
    a substrate;
    a lower super-lattice laminate disposed on the substrate; wherein the lower super-lattice laminate includes: a plurality of first lower film layers and a plurality of second lower film layers stacked alternately with each other, each of the first lower film layers includes aluminum nitride (AlN), and each of the second lower film layers includes aluminum gallium nitride (AlGaN);
    a middle super-lattice laminate disposed on the lower super-lattice laminate; wherein the middle super-lattice laminate includes: a plurality of first middle film layers and a plurality of second middle film layers stacked alternately with each other, each of the first middle film layers includes aluminum nitride (AlN), and each of the second middle film layers includes gallium nitride doped with a doping material (doped-GaN); wherein an initial doping concentration of doping concentrations in the plurality of second middle film layers including the doped-GaN along a thickness growth direction is a maximum doping concentration, and the doping concentrations in the plurality of second middle film layers including the doped-GaN decrease from the maximum doping concentration along the thickness growth direction;
    an upper super-lattice laminate disposed on the middle super-lattice laminate; wherein the upper super-lattice laminate includes: a plurality of first upper film layers and a plurality of second upper film layers stacked alternately with each other, each of the first upper film layers includes gallium nitride doped with the doping material (doped-GaN), and each of the second upper film layers includes gallium nitride (un-doped GaN); wherein doping concentrations in the plurality of first upper film layers including the doped-GaN exhibit a substantially constant value and gradual changes, and a maximum doping concentration repeatedly appears in the plurality of the first upper film layers including the doped-GaN; and
    a channel layer disposed on the upper super-lattice laminate; wherein the channel layer includes gallium nitride (un-doped GaN);
    wherein the doping material of the gallium nitride (doped-GaN) is at least one material selected from a group consisting of carbon (C), iron (Fe), manganese (Mn), magnesium (Mg), vanadium (V), chromium (Cr), beryllium (Be), and boron (B).

2. The epitaxial structure according to claim 1, further comprising: an insertion layer disposed between the lower super-lattice laminate and the middle super-lattice laminate; wherein the insertion layer includes gallium nitride (GaN), a surface roughness (RMS, root mean square) of an interface between the insertion layer and the middle super-lattice laminate is not less than 0.5 nanometers, wherein the surface roughness is measured by AFM on a measurement area of less than 20 micrometers* 20 micrometers.

3. The epitaxial structure according to claim 1, wherein aluminum (Al) contents in the plurality of second lower film layers decrease along a thickness growth direction, and gallium (Ga) contents in the plurality of second lower film layers increase along the thickness growth direction; wherein, based on a sum of the aluminum (Al) contents and the gallium (Ga) contents being 100%, an initial content of the aluminum (Al) contents along the thickness growth direction is between 70% and 90%, and a final content of the aluminum (Al) contents along the thickness growth direction is between 10% and 30%.

4. The epitaxial structure according to claim 1, wherein the middle super-lattice laminate further includes a plurality of third middle film layers, and the plurality of third middle film layers are respectively disposed between the plurality of first middle film layers and the plurality of second middle film layers; wherein each of the third middle film layers includes gallium nitride (un-doped GaN).

5. The epitaxial structure according to claim 1, wherein, in the middle super-lattice laminate, the maximum doping concentration of the doping concentrations in the plurality of second middle film layers including the doped-GaN is not less than $1E18/cm^3$.

6. The epitaxial structure according to claim 1, wherein material compositions of two film layers connected to each other respectively in the upper super-lattice laminate and the middle super-lattice laminate are both the gallium nitride doped with the doping material (doped-GaN).

7. The epitaxial structure according to claim 1, wherein, in the upper super-lattice laminate, the maximum doping concentration of the doping concentrations in the plurality of first upper film layers including the doped-GaN is not less than $1E18/cm^3$.

8. The epitaxial structure according to claim 1, wherein a material composition of a final film layer of the upper super-lattice laminate are both gallium nitride that is not doped with the doping material (un-doped GaN).

* * * * *